United States Patent [19]

Furr et al.

[11] Patent Number: 5,480,052
[45] Date of Patent: Jan. 2, 1996

[54] DOMED EXTENSION FOR PROCESS CHAMBER ELECTRODE

[75] Inventors: Michael G. Furr; Joseph Kava; Greg Blackburn; Richard McGovern, all of San Jose, Calif.

[73] Assignee: Applied Materials, Inc., Santa Clara, Calif.

[21] Appl. No.: 141,456

[22] Filed: Oct. 22, 1993

[51] Int. Cl.$^6$ .................................................. H05H 1/00
[52] U.S. Cl. .......................... 216/71; 216/67; 156/345; 118/723 E; 427/569
[58] Field of Search ........................ 456/345, 643; 118/715, 728, 723 E; 204/298.06, 298.15, 298.02, 298.31, 298.34, 192.12, 192.32; 427/569; 216/67, 71

[56] References Cited

U.S. PATENT DOCUMENTS

| | | | |
|---|---|---|---|
| 4,298,443 | 3/1981 | Maydan | 204/192 |
| 4,419,201 | 12/1983 | Levinstein et al. | 156/345 X |
| 4,786,392 | 11/1988 | Kruchowski et al. | 156/345 X |
| 4,968,374 | 11/1990 | Tsukada et al. | 156/345 |
| 5,112,185 | 5/1992 | Koike | 118/715 XZ |
| 5,298,720 | 3/1994 | Cuomo et al. | 156/345 X |

*Primary Examiner*—Thi Dang
*Attorney, Agent, or Firm*—Michael A. Glenn

[57] ABSTRACT

A domed dielectric extension is set atop a standard electrode in a bell jar shaped process chamber to decrease electrical interaction between the electrode and the process chamber and thereby decrease the stagnant plasma in the region between the electrode and the process chamber lid that promotes polymer deposition upon the inner surface of a process chamber lid. The extension, made of a process inert dielectric material such as polycarbonate, has an upper surface that is curved to conform to the shape of the inner surface of the process chamber lid and that is precisely spaced from the upper portion of the process chamber lid inner surface.

18 Claims, 3 Drawing Sheets

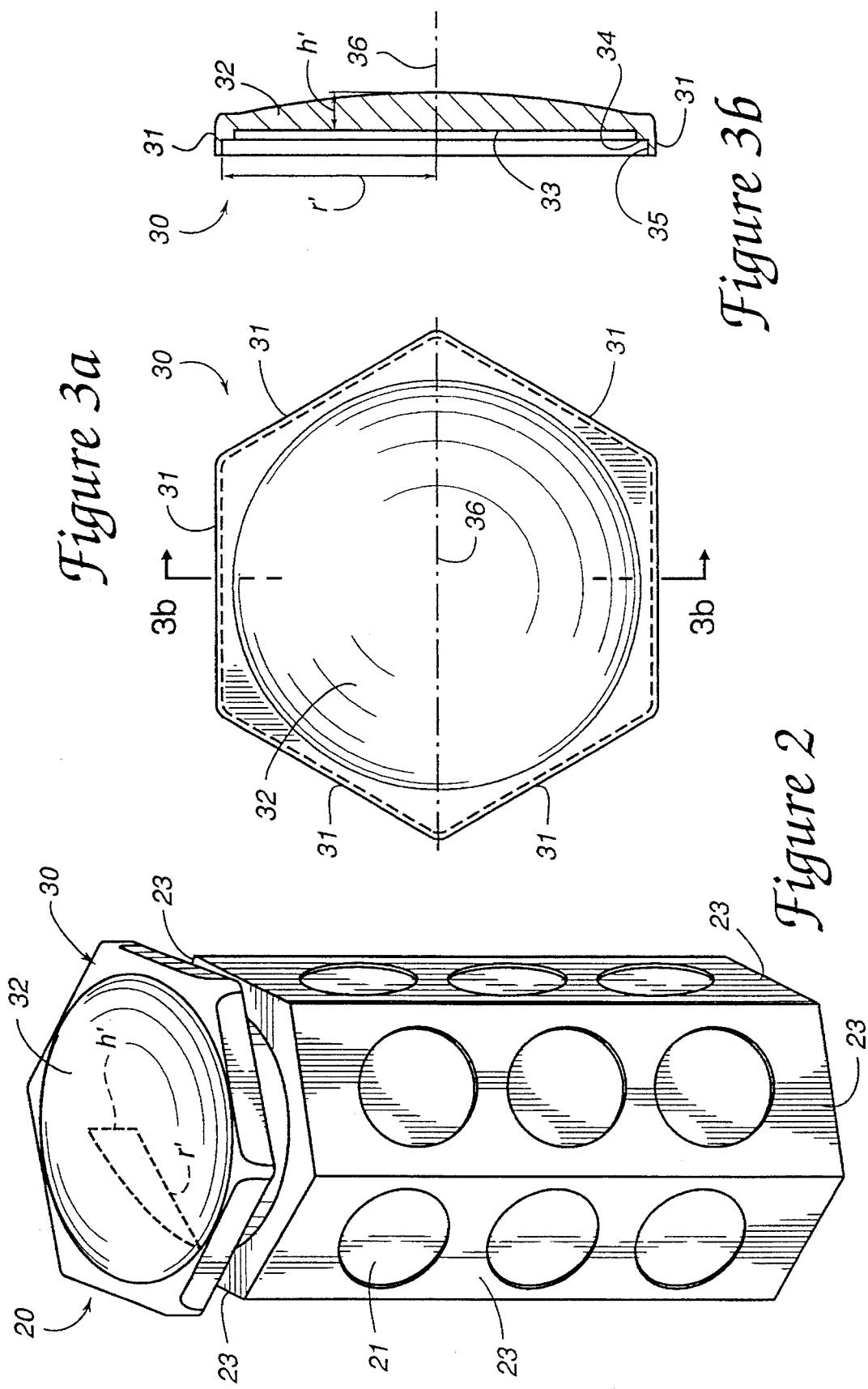

DOMED EXTENSION FOR PROCESS CHAMBER ELECTRODE

BACKGROUND OF THE INVENTION

1. Technical Field

The present invention relates to the plasma processing of semiconductor wafers within a process chamber. More particularly, the present invention relates to an improved electrode for use during the simultaneous plasma processing of multiple semiconductor wafers within a process chamber.

2. Description of the Prior Art

Present practice is to etch semiconductor wafers in a process chamber, often of the type having a bell jar shape. A multifaceted wafer holder is placed within the chamber and a source of RF energy is coupled between the chamber and the wafer holder, which also serves as an electrode, to establish a plasma within the chamber. The use of a multifaceted electrode has the advantage of allowing simultaneous anisotropic plasma etching of several semiconductor wafers, typically 10–24 wafers, depending upon wafer diameter, RF energy levels, etc. See, for example D. Maydan, High Capacity Etching Apparatus and Method, U.S. Pat. No. 4,298,443 (issued Nov. 3, 1981).

During plasma processing in a bell jar shaped process chamber an undesired polymer residue is unavoidably deposited on the inner surface of the bell jar lid. Over time the residue builds up to the point where there is an electrical interaction between the process chamber lid and the electrode during plasma processing. Such residue build-up appears in the form of a distinctive pattern that corresponds to the plan profile of the electrode. As used herein, the electrode is faceted and is described as a pentode or as a hexode, for example, based on the polygonal shape of the electrode outline as defined by the electrode facets, i.e. a pentode is a five-sided or faceted electrode and a hexode is a six-sided or faceted electrode. Thus, in applications where a pentode-shaped electrode is used, a pentagon-shaped pattern is deposited on the inner surface of the process chamber lid; where a hexode-shaped electrode is used, a hexagon-shaped pattern is deposited on the inner surface of the process chamber lid; and so on.

It is thought that such deposits occur because the region between the inner surface of the chamber lid and the electrode is a region of stagnant plasma, i.e. a region of diminished gas circulation and, hence low gas molecule velocity. The chamber is supplied with gas input and evacuation channels and ports, and both are typically relatively remote from this region, thereby contributing to the diminished circulation relative to other areas within the chamber. For example, evacuation ports are typically at the end of the process chamber opposite the lid.

The polymer deposit forms through the dissociation of the various process gases, in combination with the etched metal and carbon, most likely from the photoresist, which forms a carbon matrix or polymer of $Al_2Cl_6$, $AlCl_3$, etc. for etchants containing chlorine, and others for etchants containing fluorine, etc. Such products of dissociation and photoresist breakdown tend to persist in the limited-circulation region of the chamber. In addition, the polymer is preferentially deposited on cooler surfaces within the chamber, such as the region between the inner surface of the chamber lid and the electrode.

The deposited material is hydroscopic, i.e. it tends to fall away from the lid surface in the form of flakes or particles which can come to rest on the surface of the semiconductor wafers undergoing processing within the process chamber, and which can also build up particle residues within the chamber. Therefore, it is necessary to clean such deposits from the process chamber on a regular basis. The present accepted practice is to clean such deposits from the lid of the process chamber after the chamber is deemed unacceptable for further production. The service interval is typically a function of chamber chemistries and operating conditions. If process chamber lid cleaning is postponed, wafer and process chamber contamination becomes a serious problem, adversely affecting process yields.

However, there is a significant downtime penalty associated with cleaning the process chamber lid that adversely affects process throughput. If process chamber lid cleaning could be avoided or at least postponed, the downtime penalty associated with such cleaning could also be avoided or mitigated, resulting in improved process throughput, without negatively impacting process yields.

SUMMARY OF THE INVENTION

A dielectric barrier is placed within the region in the process chamber between the inner surface of the chamber lid and the top surface of the electrode. The dielectric is an imporous insulator of electrical energy that displaces the plasma from within said region to eliminate polymer deposition on the process chamber lid inner surface. The dielectric is conveniently provided in the form of a process inert domed dielectric extension to a multifaceted electrode in a plasma process chamber. The domed extension sits atop a standard electrode in the bell jar shaped process chamber like a cap, is curved to conform to the domed shape of the inner surface of the process chamber lid, and is dimensioned to avoid interference between the dielectric and from the inner surface of the process chamber lid, while occupying as much as that region as possible. Because the invention significantly reduces polymer deposition on the process chamber lid inner surface, the scheduled process chamber cleaning interval may be extended, thereby reducing process downtime, without compromising process yield. The plasma displacement that results from use of the invention provides a more dynamic plasma, i.e. a plasma having overall higher gas molecule velocity, and also provides a better gas flow through the chamber which flushes expended gas from the process chamber, such that the process gas contains more reactive species, all of which improves etching uniformity.

BRIEF DESCRIPTION OF THE DRAWINGS

FIG. 2 is a perspective schematic view of a standard hexode to which a domed extension is fitted according to the present invention;

FIG. 3a is a top plan view of a domed electrode extension according to the present invention;

FIG. 3b is a cross sectional view, taken along line 3b–3b in FIG. 3a, of a domed electrode extension according to the present invention.

DETAILED DESCRIPTION OF THE INVENTION

A domed extension or cap is fitted to a standard multifaceted electrode for use in a process chamber to displace the plasma from the region between the top of the electrode and the inner surface of the process chamber lid, thereby reducing unwanted polymer deposition on the inner lid surface. In this way, the interval between process chamber cleanings may be extended, thereby reducing process chamber downtime and improving wafer throughput. It has been found in practice that the invention extends the interval between process chamber lid cleaning to allow processing of at least two or three times as many wafers as was previously possible with prior art equipment, depending upon process chemistries, etc. It is expected, however, that the actual time between process chamber lid cleanings in many applications may be extended to allow even greater intervals of uninterrupted wafer processing.

The domed extension provides a dielectric that precludes the easy transport of electrons in the chamber dome region by taking up space that would otherwise be occupied by a plasma, and reduces the transport into the region of species that would otherwise occupy the space occupied by the domed extension. The domed extension itself is less likely to build up such undesired deposits because the lower surface of the extension, which is situated in the region of greatest gas molecule velocity, is generally hotter than other regions of the chamber. The upper surface of the domed extension is provided to exclude plasma from the region between the inner surface of the chamber lid and the upper surface of the domed extension as much as possible without mechanically interfering with the opening and closing of the lid, and is therefore not susceptible to any appreciable polymer deposit. Additionally, any deposit which forms on the surface of the domed extension is not likely to flake from the surface because the extension is made of a plastic material that provides a surface which is flat and porous. As such, the domed extension is also much easier to clean than the inner surfaces of the process chamber.

Figure 1:
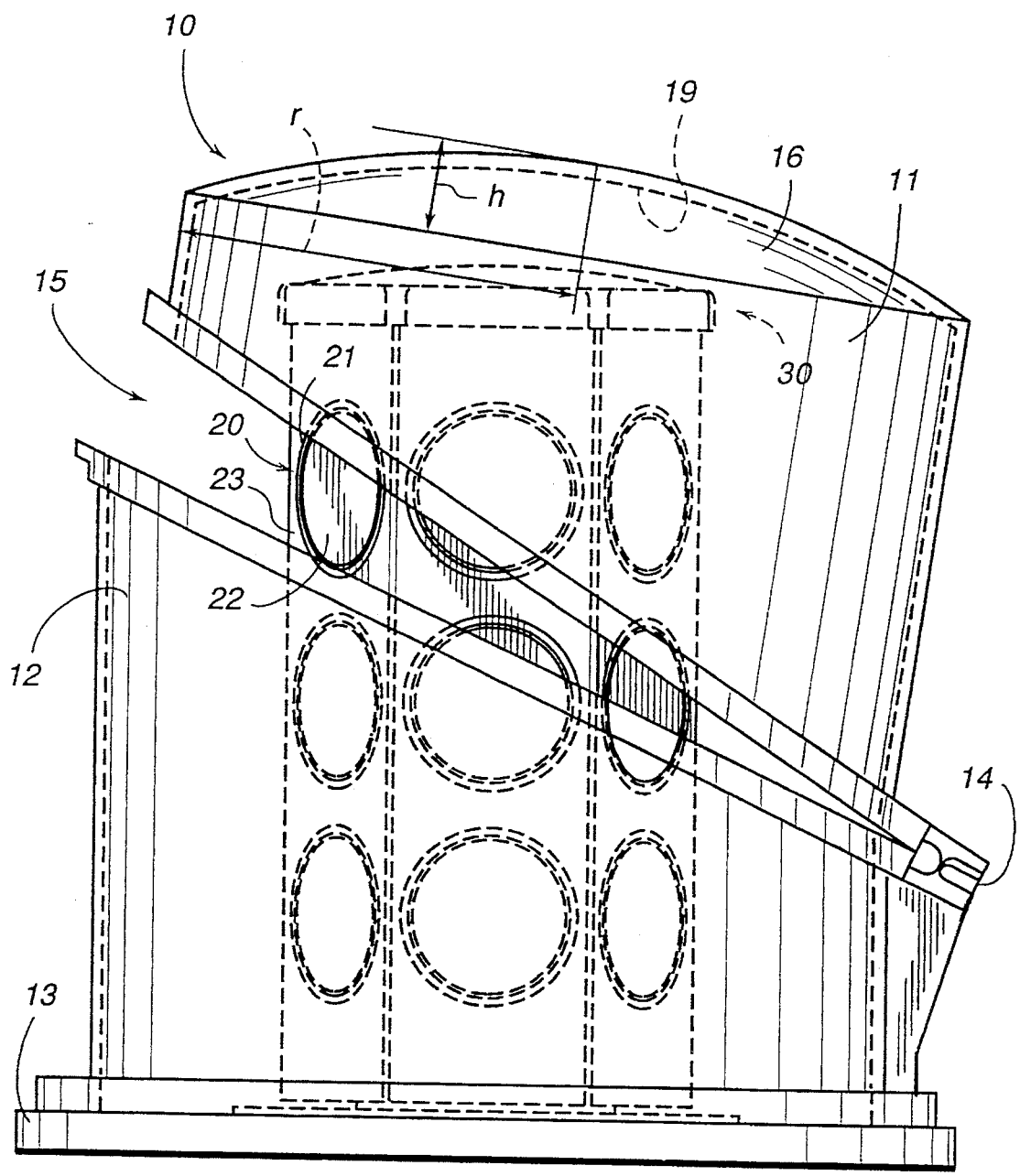
FIG. 1 is a side schematic view of a bell shaped process chamber, including a standard hexode to which a domed extension is fitted according to the present invention.

FIG. 1 is a side schematic view of a typical bell shaped process chamber 10. The process chamber 10 is supported by a base 13 and includes a chamber 12, which forms a lower portion of a processing environment. A lid 11, which forms an upper portion of the processing environment, is attached to the chamber 12 by a hinge 14. The lid is electrically connected to the chamber, such that the lid and the chamber comprise an electrode, which in the preferred embodiment is an anode. The hinge 14 is arranged to allow the lid to be raised or lowered as desired. When the lid 11 is lowered, the process chamber is sealed by conventional means (not shown), thereby allowing wafer processing to proceed within the closed environment defined by the chamber 12 and the lid 11.

An electrode 20 having a plurality of surfaces or facets 23 is placed within the process chamber through an opening 15 that results when the lid 11 is lifted. The electrode acts as a cathode and each of surfaces 23 provides several wafer sites 21 that each support and retain a semiconductor wafer 22 during wafer processing. In the preferred embodiment of the invention the electrode 20 is a hexode, i.e. it has six equally flat wafer-retaining faces or facets, although an electrode having any number of facets may be used in practicing the invention, as well as an electrode having only a single wafer site and/or surface. In the figure, the domed extension or cap 30 is shown fitted to the electrode 20 at one end thereof transverse to the wafer retaining surfaces and removed from the wafer so that the dielectric does not lie between any wafer and a chamber surface which directly faces the wafer.

A perspective schematic view of a standard hexode 20, to which the domed extension 30 has been fitted pursuant to the invention herein, is shown in FIG. 2. The upper portion 32 of the extension is contoured to conform to the curve or dome of the inner surface 19 of the upper domed portion of the process chamber lid 11. For example, the actual shape of the inner surface of the lid may be a function of the lid radius 'r', the altitude 'h' of the domed portion of the lid, and the amount of curvature or slope of the inner lid surface from a lid center point to an edge.

It is considered useful that there be a constant gap between the process chamber lid inner surface 19 and the curved or domed portion 32 of the extension 30. The actual curved surface of the upper surface or portion 32 of the extension 30 should match the curved surface of the process chamber lid 11 inner surface 19. Thus, it is desirable to provide different radii for each surface to maintain a constant minimal gap between the two surfaces. Each curvature may be calculated by known methods as a function of the surface radius 'r', altitude 'h', and slope or curvature from a center point to an edge.

To install the extension 30 in the process chamber, the extension is set directly on the electrode 20 (hence, the alternate use herein of the term 'cap' to describe the extension). When the lid of the bell jar is closed, the curvature of the extension domed surface conforms to the curve of the bell jar lid inner surface. In the preferred embodiment of the invention the extension is critically dimensioned to provide a gap of about 2.22 cm (0.875 inch) between the top surface of the extension and the inner surface of the process chamber lid. This gap may be varied from application to application as necessary, although it has been found that when the gap is too narrow there may be difficulty in providing enough clearance between the process chamber lid and the extension when the lid is closed without having the extension touching the lid surface. For proper operation of the invention and to avoid mechanical interference when opening and closing the chamber lid, it is preferred that the extension not touch the lid surface although, ideally, it would be preferred if the entire space between the lid inner surface and the electrode could be occupied by the dielectric.

If the gap between the extension and the process chamber lid inner surface is too large, the amount of plasma displaced from the region between the top of the electrode and the lid inner surface is not sufficient to avoid the unwanted polymer deposition on the lid surface. Thus, polymer build-up is not significantly reduced, thereby reducing the beneficial effect of the extension.

FIG. 3a is a top plan view of the extension 30 according to the preferred embodiment of the invention. The extension shown is intended for use with a hexode and therefore has six facets 31. It can be seen in the figure that the extension is symmetrical about a center line 36. The actual symmetry of the extension is a function of the electrode to which the invention is applied.

The dimensions of the extension are dictated by the outer dimensions of the electrode to which the extension is fitted. The extension should be dimensioned during fabrication to fit somewhat snugly to the electrode. Because the process chamber must provide for the supply of certain gases, and their circulation and evacuation, the extension should allow gases within the process chamber to flow in and out of the space between the extension and the electrode, i.e. the extension should breathe to equalize gas pressures in the region between the extension and the electrode with those of the process chamber. Otherwise, gases trapped within the region between the extension and the electrode could expand and push the extension upward into the chamber lid, thus disrupting the process within the chamber. Such gases could also be a source of trapped particles or of virtual leaks, i.e. outgassing of such gases could give a false indication of a leak as far as a leak detector is concerned because such outgassing would give the appearance that gas pressure within the chamber was unstable, which is consistent with a chamber leak.

FIG. 3b is a cross sectional view, taken along line 3b—3b in FIG. 3a, of the extension of the preferred embodiment of the invention. It can be seen from the figure that the inner portion 33 of the extension has been hollowed out. For certain processes, the insertion of the extension could create enough of a change in the total volume of plasma to give rise to a need to recalibrate the chamber. But it should be possible to compensate for the displacement of plasma by such hollowing to a sufficient degree to avoid the need to recalibrate, when compared with operating the chamber without the extension. Other processes will be found not to be sensitive to the change occasioned by the use of the extension and, consequently, little or no need to hollow the extension will be seen. In any event, because the invention is intended to be retrofitted to existing process chambers, it is not desirable to have to spend an extensive amount of time recalculating critical processing parameters for the more sensitive processes to compensate for such volume displacement as may be occasioned by use of the extension. Thus, it is preferred that the extension be provided with a hollow inner portion to minimize the amount of volume displacement attendant with placing the extension in the chamber.

It is also preferred that the extension be formed to sit or rest loosely on the electrode. In the preferred embodiment of the invention a ledge 34 is provided for this purpose. The extension should not fit so snugly that it seals the hollowed out inner volume defined by the region between the top of the electrode and the extension for reasons stated above. Aditionally, the inner rim 35 of the extension should have a diameter that is sufficiently larger than the outer diameter of the electrode to permit the extension to be readily engaged with and disengaged from the electrode.

The amount by which the extension edges 35 (FIG. 3b) overhang the electrode is not considered a particularly critical dimension with regard to practicing the preferred embodiment of the invention. The overhang should be of sufficient length to hold the extension in place, but it should not so long that it interferes with ability of a user to load and unload semiconductor wafer to and from the faceted wafer holders of the electrode.

Figure 4:
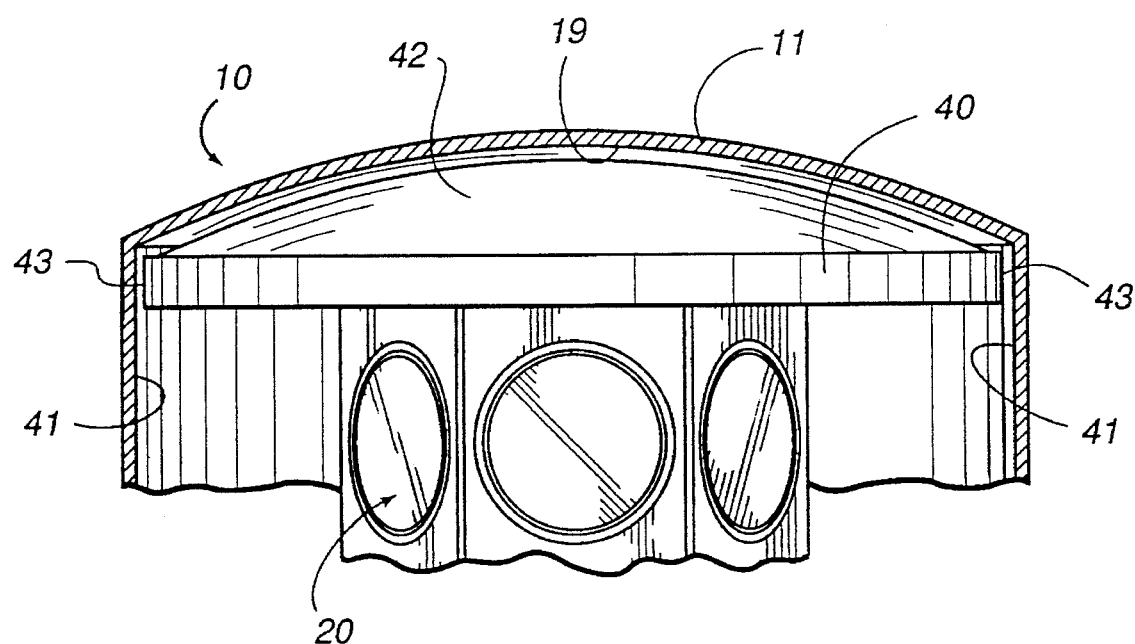
FIG. 4 is a side schematic view of a bell shaped process chamber, including a standard hexode to which a domed extension is fitted according to a second embodiment of the present invention.

FIG. 4 is a side schematic view of a bell shaped process chamber, including a standard hexode to which a domed extension is fitted according to a second embodiment of the present invention. In the embodiment of FIG. 4, the domed extension 40 includes a domed portion 42 having a slope that corresponds to that of the dome inner surface 19. However, the domed extension has a radius that extends the dielectric such that the entire region above the electrode 20 is occupied by the dielectric. Thus, the domed extension has an outer edge 43 that extends almost up to the point of contact with the chamber inner walls 41.

In both embodiments of the invention, the extension should be thick enough to be rigid and stable when in place. It is preferred that the extension have sufficient thickness to withstand repeated and extended exposure to the plasma environment within the process chamber.

The preferred material from which the extension or cap may be made is a polycarbonate material, such as Lexan 101, which is manufactured by General Electric Corporation of Schenectedy, New York. It has been found that such material withstands extended and repeated exposures to the severe environment within the process chamber, including exposure to the plasma and the corrosive reactants, such as $Cl_2$, $BCl_3$, process chemicals, such as $CF_4$, $CHF_3$, and others, alone or in combination, which are part of the plasma process.

The extension could also be made using materials other than polycarbonate materials. It is necessary when selecting such material that the material chosen be an insulator. The material must also exhibit a higher dielectric constant than that of the environment within process chamber during plasma processing, while being able to withstand repeated and extended exposure to the harsh environment within the process chamber. The extension may be machined to shape on a precision programmable mill using known machining techniques, or the extension may also be cast or molded.

Because the extension is slowly consumed as a result of repeated exposure to plasma conditions within the process chamber, the material from which the extension is formed should be neutral during consumption, i.e. consumption of the extension should not poison the process taking place within the process chamber. During such plasma processing related consumption, the extension should not produce more than a minimal amount of particulants (if any). Additionally, the extension should be formed from a pure material that does not have metal constituents which could otherwise contaminate the process taking place within the process chamber. Thus, the material should be free from contaminants that would degrade the wafer being processed in the chamber, e.g. the material should be free of any heavy metal, such as iron, sodium, and potassium, and the material should not produce free mobile ions that could damage the devices being etched into the wafer.

Although the invention is described herein with reference to the preferred embodiment, one skilled in the art will readily appreciate that other applications may be substituted for those set forth herein without departing from the spirit and scope of the present invention. For example, although a process chamber having a specific bell jar arrangement is shown, including a hinged upper and lower portion, any type of process chamber may be used in connection with the present invention, e.g a process chamber having its upper and lower portions secured by screws, etc. The process chamber may also be proportioned and/or shaped differently than the exemplary process chamber shown herein. For example, the process chamber lid may be secured at a very top portion of a process chamber; or the lid may be incorporated into the chamber such that an integrated lid and chamber is secured to the base portion of the chamber. Additionally, any type of multi-faceted electrode may be used in practicing the invention. Accordingly, the invention should only be limited by the claims included below.

We claim:

1. A process for preventing polymer deposition on an inner surface of a wafer plasma processing chamber within which is located an electrode adapted to retain one or more wafers to be processed, comprising the steps of:

placing a dielectric in the region between a portion of said electrode and a proximate process chamber inner surface so that such dielectric does not lie between a wafer and a facing surface of said chamber, wherein said region is between said chamber inner surface and a portion of said electrode which is not adapted to retain wafers, wherein said dielectric is an extension of said electrode, wherein said dielectric is provided with a curved upper surface, and in which at least a portion of said process chamber inner surface is curved, wherein said curved upper surface conforms to tile curve of said proximate process chamber inner surface.

2. In a process chamber, including a multifaceted electrode within said chamber, an apparatus for reducing polymer deposition on a curved inner surface of a process chamber lid during plasma processing, comprising:

an electrode extension situated atop said electrode, said extension having a curved upper surface, wherein said extension provides a dielectric in the region between a top portion of said electrode and said curved inner surface of said process chamber lid.

3. The apparatus of claim 1, wherein said extension curved upper surface conforms to the curved inner surface of the process chamber lid.

4. The apparatus of claim 1, wherein said extension is in contact with said electrode at its periphery and said extension is hollowed inwardly of said periphery.

5. The apparatus of claim 1, wherein said extension has a continuous downward rim extending about the perimeter of said extension, an inner surface of said rim being so configured as to loosely mate with and hold the extension in place to the top portion of said electrode.

6. The apparatus of claim 1, wherein said extension defines a hollow inner region between the top portion of said electrode and an inner extension surface when said extension is placed atop said electrode, said hollow inner region being in communication with an inner volume defined by said process chamber, wherein said extension provides a dielectric in the region between said curved inner surface of the process chamber lid and the top portion of the electrode.

7. The apparatus of claim 1, wherein said extension exhibits better dielectric properties than those within the process chamber in the region between a top portion of said electrode and said curved inner surface of said process chamber lid.

8. The apparatus of claim 1, wherein said extension is made of a polycarbonate material.

9. The apparatus of claim 1, wherein said extension is made of a process neutral material having no metallic constituents.

10. The apparatus of claim 1, wherein said extension does not touch said curved inner surface of the process chamber lid when the lid is closed and the process chamber is sealed.

11. The apparatus of claim 1, wherein a consistent gap is provided between said extension and said curved inner surface of the process chamber lid when said lid is closed and the process chamber is sealed, said gap being sufficient to allow said process chamber lid to be closed without touching said extension, and being narrow enough to allow said extension to displace plasma from the region between the top portion of said electrode and the curved inner surface of the process chamber lid.

12. The apparatus of claim 1, in which said extension provides a dielectric body closely spaced from said process chamber curved inner surface.

13. The apparatus of claim 1, in which said curved upper surface of said extension facing said process chamber curved inner surface is uniformly spaced therefrom.

14. In a plasma processing chamber having an inner surface, and in which one or more wafers to be processed are positioned upon an electrode, an apparatus for minimizing polymer deposition, comprising:

a dielectric body in contact with said electrode at a location spaced from a wafer and extending into a region between said electrode and an adjacent inner surface of said process chamber wherein said electrode is comprised of a plurality of substantially flat faces, said wafers being retained on said faces in facing relationship to the inner surface of said processing chamber, and in which said dielectric body is situated between said electrode and the inner surface of said chamber at a location removed from that of said wafer.

15. The apparatus of claim 14, in which said dielectric body's location is transverse to those of substantially flat faces of said electrode which retain wafers.

16. The apparatus of claim 14, wherein said dielectric body is made of a process neutral material having no metallic constituents.

17. The apparatus of claim 16, wherein said dielectric body is made of a polycarbonate material.

18. The apparatus of claim 17, wherein said process chamber has an upper domed portion, and wherein said dielectric body has an outer edge that extends almost up to the point of contact with said inner surface of said upper domed portion of said process chamber.

* * * * *